United States Patent
Ding et al.

(10) Patent No.: US 9,209,791 B2
(45) Date of Patent: Dec. 8, 2015

(54) CIRCUITS AND METHODS FOR CANCELLING NONLINEAR DISTORTIONS IN PULSE WIDTH MODULATED SEQUENCES

(71) Applicant: Texas Instruments Incorporated, Dallas, TX (US)

(72) Inventors: Lei Ding, Plano, TX (US); Rahmi Hezar, Allen, TX (US); Joonhoi Hur, San Diego, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 176 days.

(21) Appl. No.: 14/020,242

(22) Filed: Sep. 6, 2013

(65) Prior Publication Data

US 2015/0070088 A1    Mar. 12, 2015

(51) Int. Cl.
*H03K 7/08*    (2006.01)
(52) U.S. Cl.
CPC ........................................ *H03K 7/08* (2013.01)
(58) Field of Classification Search
CPC ....................................................... H03K 7/08
USPC ......................................................... 327/172
See application file for complete search history.

(56) References Cited

U.S. PATENT DOCUMENTS

| | | | | |
|---|---|---|---|---|
| 5,027,119 A * | 6/1991 | Toyomaki | | 341/144 |
| 5,548,286 A * | 8/1996 | Craven | | 341/126 |
| 6,657,566 B1 | 12/2003 | Risbo et al. | | |
| 7,209,878 B2 * | 4/2007 | Chen | | 704/220 |
| 7,298,305 B2 * | 11/2007 | Melanson | | 341/143 |
| 8,633,842 B2 * | 1/2014 | Azadet et al. | | 341/143 |
| 2012/0069931 A1 * | 3/2012 | Gandhi et al. | | 375/296 |
| 2013/0156089 A1 * | 6/2013 | Hezar et al. | | 375/238 |

FOREIGN PATENT DOCUMENTS

WO    WO 9737433 A1 *    10/1997    ............. H03M 5/08

* cited by examiner

*Primary Examiner* — Ryan Jager
(74) *Attorney, Agent, or Firm* — Michael A. Davis, Jr.; Frank D. Cimino

(57) ABSTRACT

A method of canceling nonlinear distortions in pulse width modulated signals includes receiving an input signal. A first signal that is the modulated input signal is generated. The first signal has quantized levels representing the input signal. A pulse width modulated (PWM) sequence that is representative of the first signal is generated. A second signal that is the PWM sequence mixed with a carrier signal is generated. An error signal is generated in response to the first signal and modeled from the second signal. The error signal is added to the input signal.

20 Claims, 5 Drawing Sheets

CIRCUITS AND METHODS FOR CANCELLING NONLINEAR DISTORTIONS IN PULSE WIDTH MODULATED SEQUENCES

BACKGROUND

Pulse width modulation (PWM) is used in some communications applications. PWM signals, which are also referred to as PWM sequences, may originate from analog signals that have been sampled or by other signals that have been quantized. In some applications, delta-sigma modulation (DSM) is applied to the quantized signals. In DSM, a voltage level is generated during a specific sampling period, wherein the voltage level is representative of the value of the voltage during the sampling period.

The generation of PWM sequences from DSM signals is a nonlinear process, which results in nonlinear distortions such as noise folding. The nonlinear distortions limit the inband signal to noise ratio and the out of band adjacent channel power ratio performance. Further noise is introduced into the PWM sequences if these signals are mixed with a carrier signal. Therefore, the PWM sequences are limited in many communications applications.

SUMMARY

For canceling nonlinear distortions in pulse width modulated signals, an input signal is received. A first signal that is the modulated input signal is generated. The first signal has quantized levels representing the input signal. A pulse width modulated (PWM) sequence that is representative of the first signal is generated. A second signal that is the PWM sequence mixed with a carrier signal is generated. An error signal is generated in response to the first signal and modeled from the second signal. The error signal is added to the input signal.

DETAILED DESCRIPTION

Circuits and methods for cancelling or reducing nonlinearities in pulse width modulated (PWM) sequences are disclosed in this specification. The term "PWM sequence" is used herein and is synonymous with "PWM signal". More specifically, the circuits and methods disclose modeling distortions in PWM sequences and cancelling the distortions using delta-sigma modulation (DSM).

Figure 1:
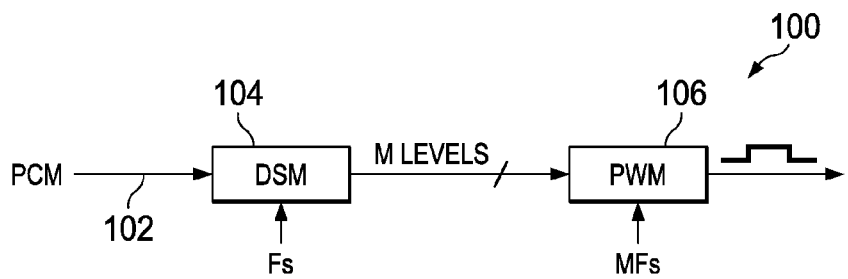
FIG. 1 is a block diagram of an embodiment of a PWM system used for low frequency applications.

FIG. 1 shows a block diagram of a PWM system 100 used for low frequency applications, such as audio applications. The system 100 cannot be used for radio frequency (RF) applications due to nonlinearities and other problems described below. For example, the PWM output has most of its energy in low frequency regions. The output has to be mixed with a carrier for converting the low frequency energy, which is around DC, to a carrier frequency. In some embodiments, the carrier frequency is around 1 GHz.

The circuit 100 has an input 102 that receives a signal. In the embodiment of FIG. 1, the input signal is a pulse-code modulated (PCM) signal. In some embodiments, the PCM signal is quantized voltage levels representing samples of an analog signal. The PCM signal is input to a first modulator 104, which in the embodiment of FIG. 1 is a delta-sigma modulator 104. The delta-sigma modulator 104 operates at a frequency $F_S$ and converts the PCM signal to a delta-sigma modulated (DSM) signal having amplitude levels referred to as M. More specifically, the delta-sigma modulator 104 converts the voltages of the PCM signal to a series of pulses wherein the amplitude of a pulse within a specific period, which is sometimes referred to as a sampling period, represents the voltage level of the PCM signal during the sampling period. The DSM signal is input to a pulse width modulator 106 that converts the amplitude of the DSM signal to pulse widths. The pulse width modulator 104 operates at a frequency of $MF_S$. In some embodiments, the PCM signal is quantized in that there are only a predetermined number of PCM voltage levels that are detected in the sampling period. Therefore, the DSM signal is quantized to a predetermined maximum number of pulse amplitudes in the sampling period and the PWM sequence has a limited number of different pulse widths that may be generated. The conversion from the DSM signals to the PWM sequences is nonlinear and has the problems described above, wherein the energy is in the low frequency regions, which does not enable it to be used in RF applications.

Figure 2:
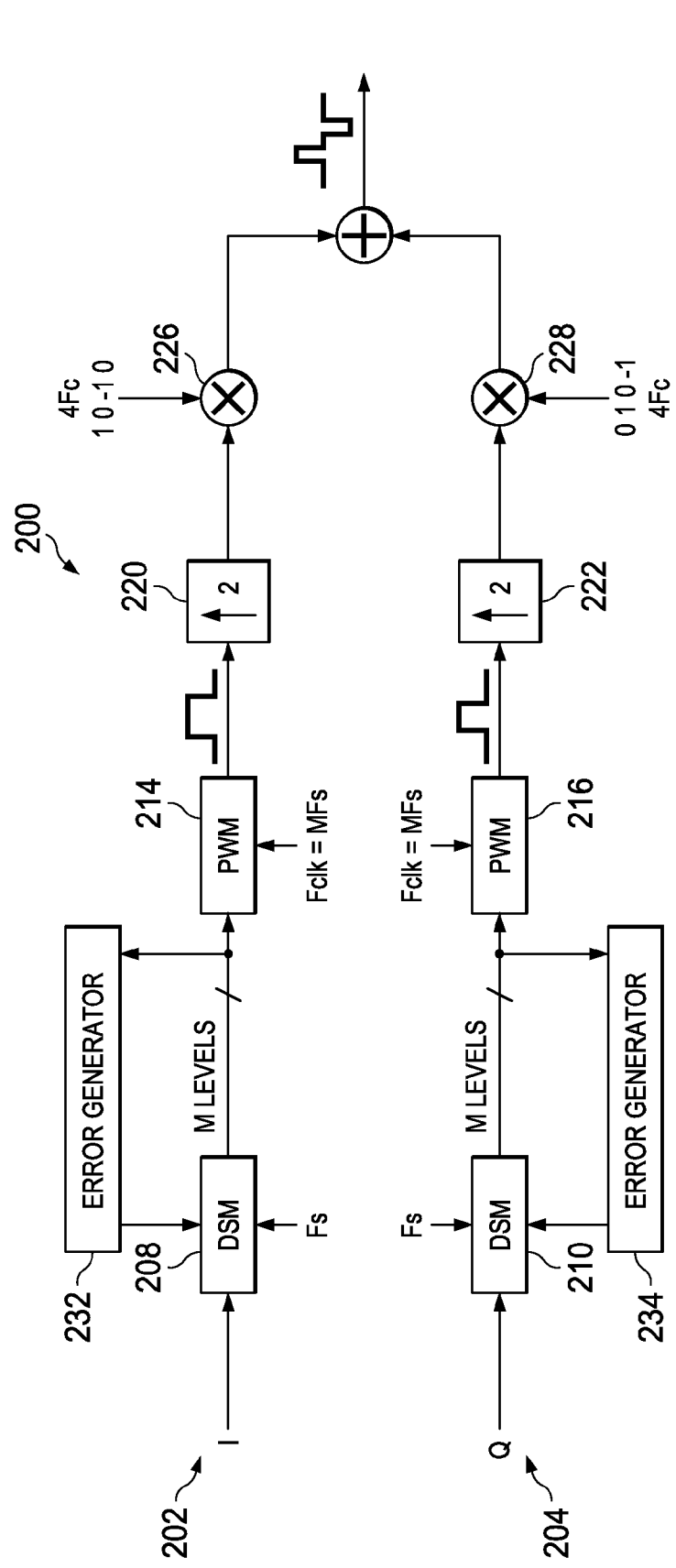
FIG. 2 is a block diagram of a circuit for removing some nonlinearities caused by modulation.

Some of the problems with the circuit 100 of FIG. 1 are resolved by the circuit 200 of FIG. 2. The circuit 200 has a first input 202 and a second input 204 that receive components of a complex signal. In the embodiment of FIG. 2, the first input 202 receives the I component and the second input 204 receives the Q component of the complex signal. The first input 202 is sometimes referred to as the I input 202 and the second input 204 is sometimes referred to as the Q input 204. The I input 202 is connected or coupled to a first delta-sigma modulator 208 and the Q input 204 is connected or coupled to a second delta-sigma modulator 210. As with FIG. 1, the delta-sigma modulators 208 and 210 convert the I and Q signals to DSM signals having a plurality of voltage levels, wherein the number of different voltage levels is referred to as M. The delta-sigma modulators 208 and 210 operate at a frequency $F_S$. The delta-sigma modulators 208 and 210 convert the I and Q components to DSM signals wherein the amplitude of a DSM signal during a sampling period corresponds to the average voltage level of the input signal during the sampling period.

The DSM signals are input to pulse width modulators 214 and 216 wherein the DSM signals are converted to PWM sequences. The pulse width modulators 214 and 216 operate at a frequency of $MF_S$, where M is the number of amplitude levels of the DSM signals. The PWM sequences are upsampled by first and second sampling circuits 220 and 222. In some embodiments, the upsampling is performed by way of sample and hold techniques. In the embodiment of FIG. 2, the pulse width modulated signals are upsampled by two, which creates a null at $2F_c$, where $F_c$ is a carrier frequency.

The upsampled signals are mixed by quadrature mixers 226 and 228 at a sampling rate of $4F_c$.

Figure 7:
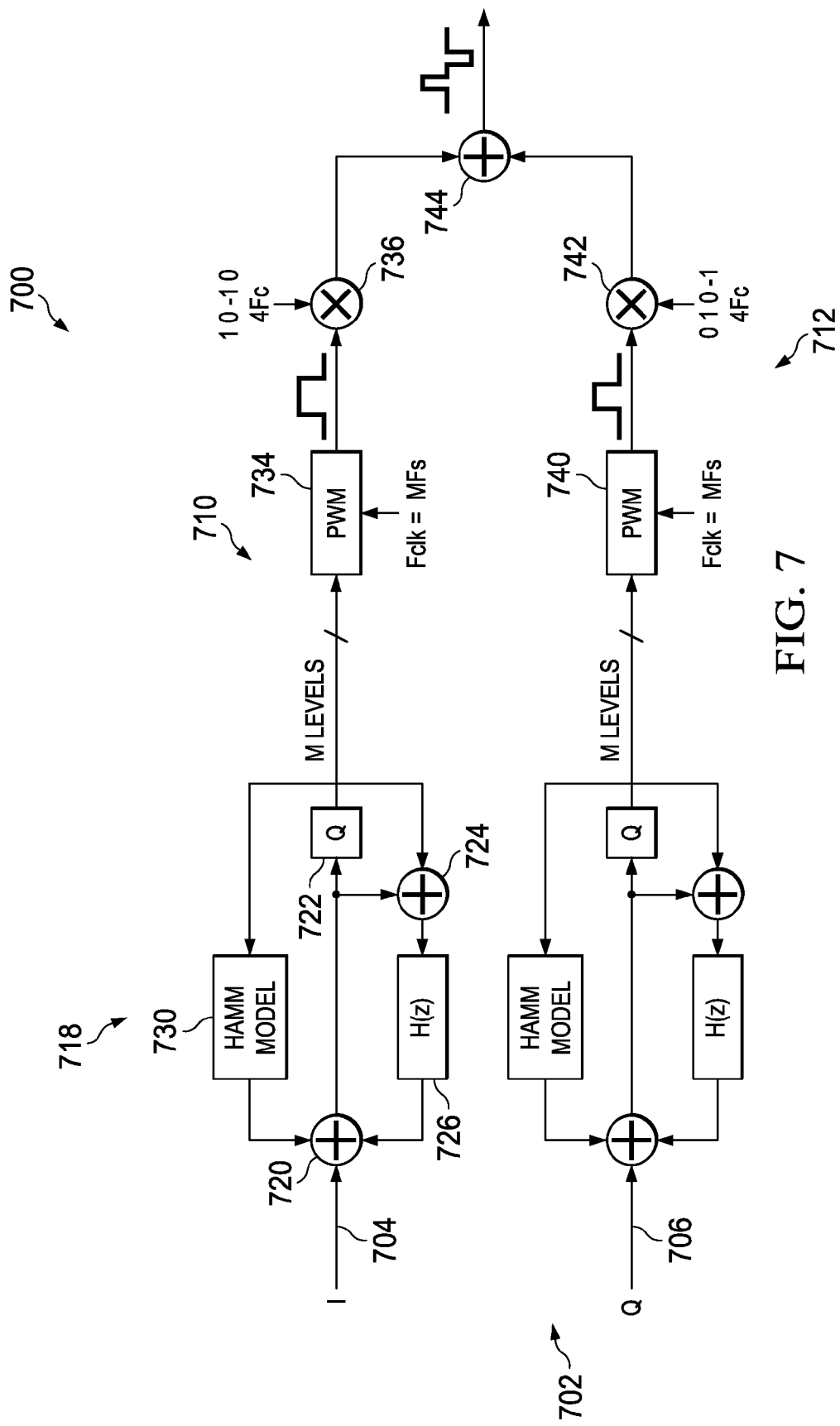
FIG. 7 is a block diagram of an embodiment of a circuit for cancelling nonlinear distortions in PWM signals.
Figure 9:
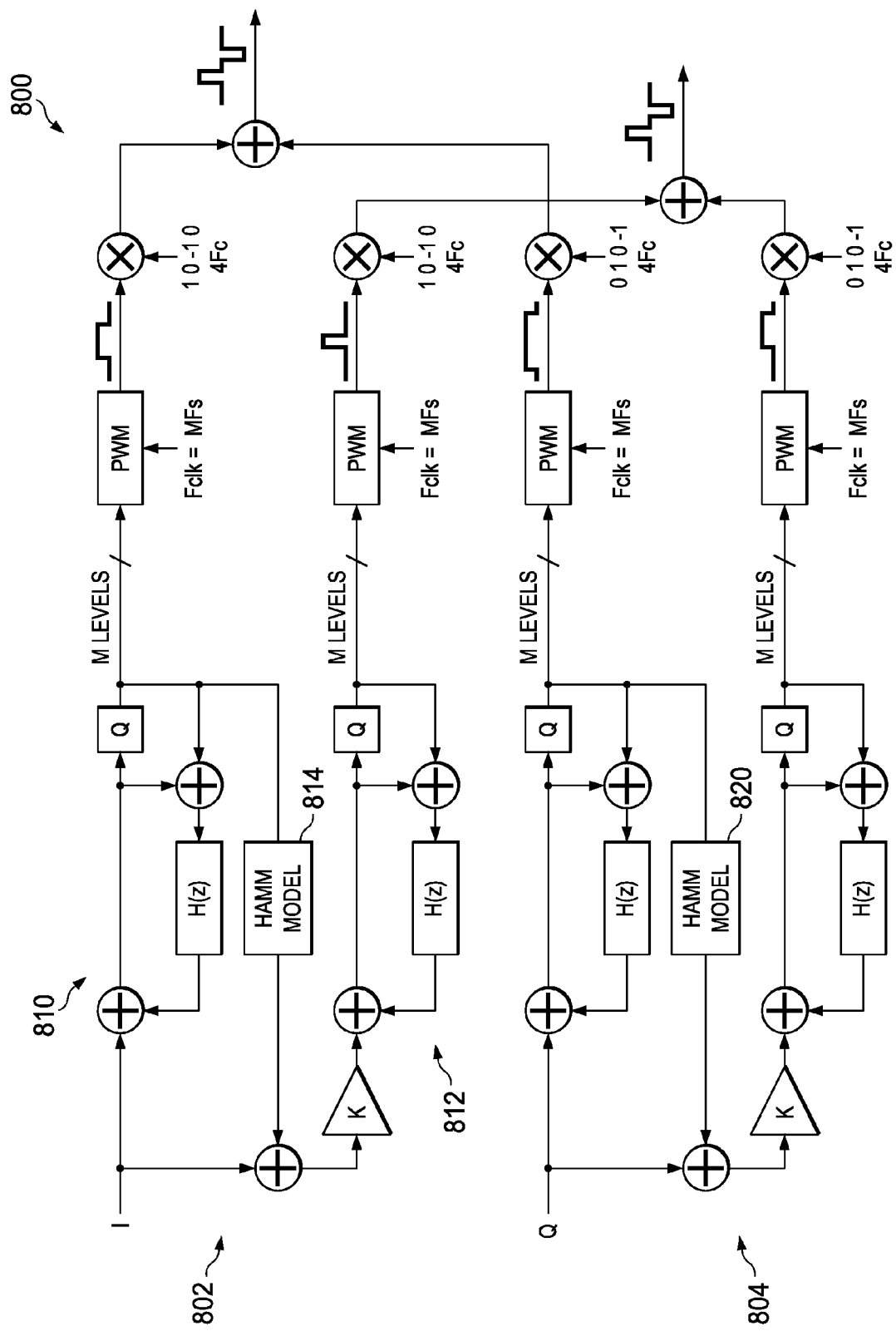
FIG. 9 is a block diagram of another embodiment of a circuit for cancelling nonlinear distortions in PWM signals.

The upsampling at $2F_c$ creates a perfect null at $2F_c$, which avoids distortion fold back in-band after carrier mixing. However, the upsampling reduces the number of PWM pulse widths, thereby reducing the number of levels that the delta-sigma modulator 208 may output. It also increases quantization noise at the output of the delta-sigma modulator 208. For example, in FIG. 2, because of upsampling by 2, Fclk=2Fc. In FIGS. 7 and 9, the upsampling is removed and Fclk=4Fc, which doubles the possible number of PWM widths if the delta-sigma modulators 208 and 210 operate at the same rate of Fs. However, if upsampling is removed, the distortions at $2F_c$ fold back to the signal after mixing. In the embodiments described herein, the distortions at $2F_c$ are modeled by error generators 232 and 234 and subtracted from the original signal, which reduces the distortions at $2F_c$. Because the signal is low frequency before mixing, the distortion at $2F_c$ needs to be converted to low frequency and then subtracted from the original signal. Instead of mixing the distortion at 2Fc to low frequency, the distortion at 2Fc is modeled at low frequency and subtracted from the original signal.

In some of the embodiments described herein, the circuit 200 uses discrete signals. Therefore, the DSM signal is quantized to a predetermined maximum number. For example, the DSM signal may represent the I input using a maximum of sixteen values. Accordingly, the DSM signal has between one and sixteen amplitude levels that may occur during each sampling period. It follows that the pulse lengths and polarities of the PWM sequence is quantized to the same number as the number of levels in the DSM signal. In the example above, the PWM sequence is limited to sixteen different pulse length and polarity combinations. Therefore, there are only sixteen possible error signals that need to be generated by the error generators 232 and 234. The error signals are modeled based on the mixed PWM signals. By sampling the DSM signals, the error generators 232 and 234 select the correct error signal from one of sixteen possible error signals and feed them back to the input. The result is that the distortions are cancelled using the low frequency of the DSM signals rather than a high frequency mixed PWM sequence that would have to be mixed to a low frequency.

Figure 3:
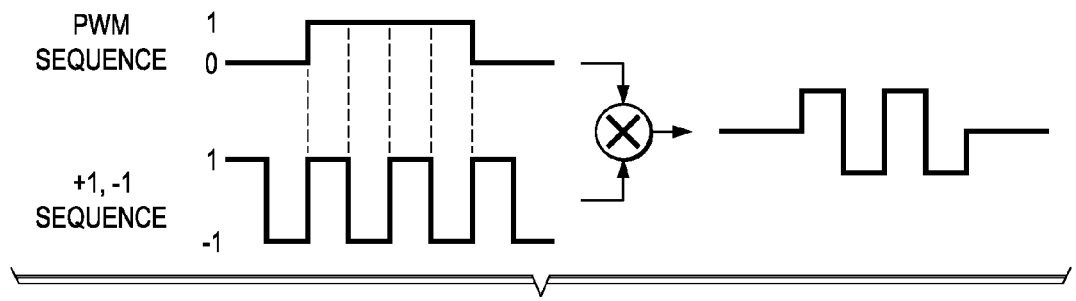
FIG. 3 is a diagram showing the results of mixing a pulse coded signal with a 1, −1 signal.
Figure 4:
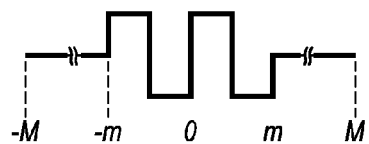
FIG. 4 is a diagram showing the time-domain waveform of the signal generated in FIG. 3.

The mixing based on discrete signals will now be described in order to provide embodiments of the error signals that are modeled by the error generators 232 and 234 and other error generators described below. An example of the mixing is shown in FIG. 3, where a PWM sequence with amplitudes of zero, −1, and +1 is mixed with a −1, +1 sequence. The frequency of the sequence is 2Fc and the sampling rate is 4Fc. Each period of the signal contains a −1 and a +1. FIG. 3 shows that the distortions around $2F_c$ can be shifted to DC by mixing the PWM sequence with the −1, +1 sequence. As shown, the low frequency distortion in the waveform after mixing is the same as the distortion around $2F_c$ before mixing, the mixing simply shifts the frequency location of the distortion. FIG. 4 shows an example of the time-domain waveform for the signal generated in FIG. 3. As shown in FIG. 4, the PWM sequence after mixing is centered around DC and extends between −m and +m, where −m and +m are between −M and +M. The shifted distortion is added to the delta-sigma modulators 208 and 210 so that the PWM sequence after mixing is not affected by the distortion. In the embodiment of FIG. 2, the shifted distortion or error is modeled by the error generators 232 and 234 and added to the delta-sigma modulators 208 and 210.

The discrete-time Fourier transform (DTFT) of the mixed PWM signal of FIG. 4 is:

$$X(e^{j\omega}) = \frac{1}{M}\sum_{n=-m}^{m-1}(-1)^n e^{-j\omega n} \quad \text{Equation (1)}$$

The term 1/M is a normalization factor. Equation (1) can be simplified to equation (3) via equation (2) using Taylor Series expansion as shown below.

$$X(e^{j\omega}) = \frac{1}{M} e^{\frac{j\omega}{2}}(-1)^m j \frac{\sin(m\omega)}{\cos\left(\frac{\omega}{2}\right)} \quad \text{Equation (2)}$$

$$X(e^{j\omega}) = \frac{1}{M} e^{\frac{j\omega}{2}}(-1)^m j\left[m\omega + \frac{1}{3!}\left(\frac{3m}{4} - m^3\right)\omega^3 + \ldots\right] \quad \text{Equation (3)}$$

The DTFT of a PWM sequence is described as equation (4) as follows:

$$Y(e^{j\omega}) = \Sigma_n \Sigma_k p(m_k, n-Mk)e^{-j\omega n} \quad \text{Equation (4)}$$

Equation (4) simplifies to equation (5), which is written below.

$$Y(e^{j\omega'}) = \sum_k e^{\frac{j\omega'}{2M}}(-1)^{m_k}\left[m_k \frac{j\omega'}{M^2} - \frac{1}{3!}\left(\frac{3m_k}{4} - m_k^3\right)\frac{(j\omega')^3}{M^4} + \ldots\right]e^{-j\omega' k} \quad \text{Equation (5)}$$

The signal of equation (5) is passed through an ideal low pass filter and the result is decimated by a factor of M, wherein a new value of ω' is Mω, which yields equation (6) as follows:

$$Y(e^{j\omega'}) = \sum_k e^{\frac{j\omega'}{2M}}(-1)^{m_k}\left[m_k \frac{j\omega'}{M^2} - \frac{1}{3}\left(\frac{3m_k}{4} - m_k^3\right)\frac{(j\omega')^3}{M^4}\right]e^{-j\omega' k} \quad \text{Equation (6)}$$

Figure 5:
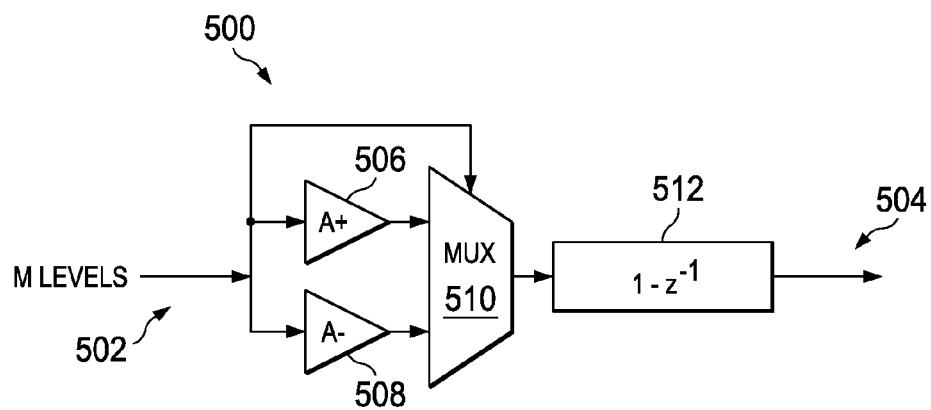
FIG. 5 is an embodiment of a Hammerstein model used in the circuits described herein.

The second term in equation (6) is omitted in the rest of the analysis because it is very small compared with the first term in equation (6). Equation (6) is applied to an error model, such as a Hammerstein model 500 as shown in FIG. 5. The model 500 has an input 502 and an output 504. The input is a DSM signal, such as that from a delta-sigma modulator as described above, wherein the signal consists of pulses having M number of possible amplitudes. The model 500 includes two amplifiers 506 and 508 that are referred to as scaling factors noted as A and −A. The scaling factor "A" or amplification is defined by equation (7) as follows:

$$A = \frac{m_k}{M^2} \quad \text{Equation (7)}$$

The outputs of the amplifiers 506 and 508 are inputs to a multiplexer 510. The input 502 is connected or otherwise coupled to the control of the multiplexer 510. The output of the multiplexer 510 is connected to a discrete time domain differentiator 512. For odd input, the −A branch is selected and for even input, the +A branch is selected. The differentiator 512 approximates the jω' term from equation (6). In the time domain, the jω' term is represented by the differentiation operation. In other embodiments, the coefficients of the $j\omega'$ term are obtained numerically, such as by a look up table. In equation (6), the coefficient of the $j\omega'$ term is the derivative of the equation $Y(e^{j\omega'})$ evaluated at DC because this is the Taylor series approximation. Therefore, for a discrete low-frequency PWM sequence, x(n), the coefficient is determined numerically by equation (8) as:

$$\frac{1}{M^2} \sum_{n=-m}^{m-1} (-1)^n n x(n) \qquad \text{Equation (8)}$$

Figure 6:
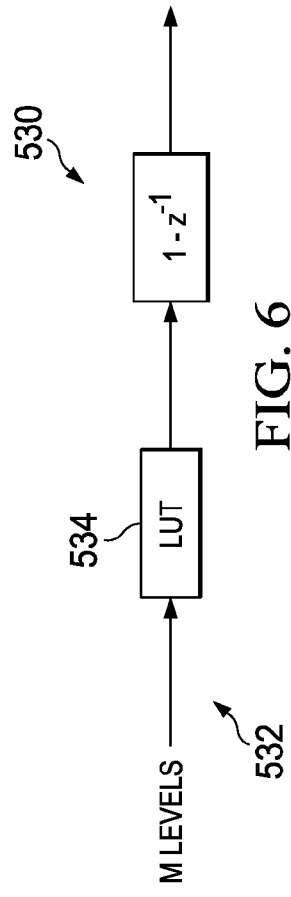
FIG. 6 is an embodiment of a generic Hammerstein model.

Equation (8) is applied to a generic Hammerstein model 530 as shown in FIG. 6 and as described below. The Hammerstein model 530 has an input 532 that receives the signals from the delta-sigma modulator 208 and 210, FIG. 2, or other source of signals that is to be input to a pulse width modulator. As shown in FIG. 6, the Hammerstein model 530 uses a look up table 534 to determine the above-described coefficients. The use of look up tables is typically faster than performing the calculations to determine the coefficients. As stated above, in some embodiments, the DSM signal is quantized, so the look up table only needs to have as many coefficients as the number of possible DSM signals.

The above-described equations and circuit components are put together to form a circuit for cancelling or otherwise reducing nonlinear distortions in a PWM sequence. An example of such a circuit 700 is shown in FIG. 7. The circuit 700 has an input 702 that receives the I and Q components of a complex input signal. The I component is received on a first input 704, sometimes referred to as the I input 704, and the Q component is received on a second input 706, which is sometimes referred as the Q input 706. The I component is processed by a portion of the circuit 700 referred to as the I processor 710 and the Q component is processed by a portion of the circuit 700 referred to as the Q processor 712. In some embodiments, the I processor 710 and the Q processor 712 are identical.

The first processor 710 includes a delta-sigma modulator 718. As described above, the delta-sigma modulator 718 converts the voltage levels at the I input 704 to quantized amplitudes for a specific period wherein the amplitudes are proportional to the average voltage levels at the I input 704 during sampling periods. The delta-sigma modulator 718 includes a summer 720 that is connected to the I input 704 as described further below. The output of the summer 720 is connected to a quantizer 722 wherein the output of the quantizer 722 is the output of the delta-sigma modulator 718. The output of the summer 720 is also connected to a second summer 724. The output of the summer 724 is connected to a filter 726, which, in some embodiments, is a linear filter and/or a low-pass linear filter. The output of the filter 726 is connected to the summer 720. The filter performs quantization noise shaping. A circuit 730 representing a Hammerstein model is connected between the output of the delta-sigma modulator 718 and the summer 720. The circuit 730 follows either model shown in FIG. 5 or 6 and the equations related thereto. In other embodiments, other models using different equations may be used.

The output of the delta-sigma modulator 718 is connected to a pulse width modulator 734. The pulse width modulator 734 converts the DSM signals, which have been quantized to a level of M possible amplitudes, to PWM sequences. The output of the pulse width modulator 734 is connected to a mixer 736, which performs quadrature mixing on the PWM sequences as described above.

The Q processor 712 is identical to the I processor 710 and includes a pulse width modulator 740 and a mixer 742. The mixer 742 performs quadrature mixing on the PWM signals from the pulse width modulator 740. In some embodiments, the two data streams or sequences are ninety degrees out of phase. The processed I and Q signals are added together by a summer 744.

The circuit 730 models the distortions in the PWM sequences and feeds the distortions back to the input of the delta-sigma modulator 718. The feedback reduces or eliminates the distortions from being present in the PWM sequences generated by the pulse width modulator 734 and the subsequent signal processing. Therefore, when the PWM sequences are mixed, such as with the carrier signal, the distortions will not be present.

Figure 8:
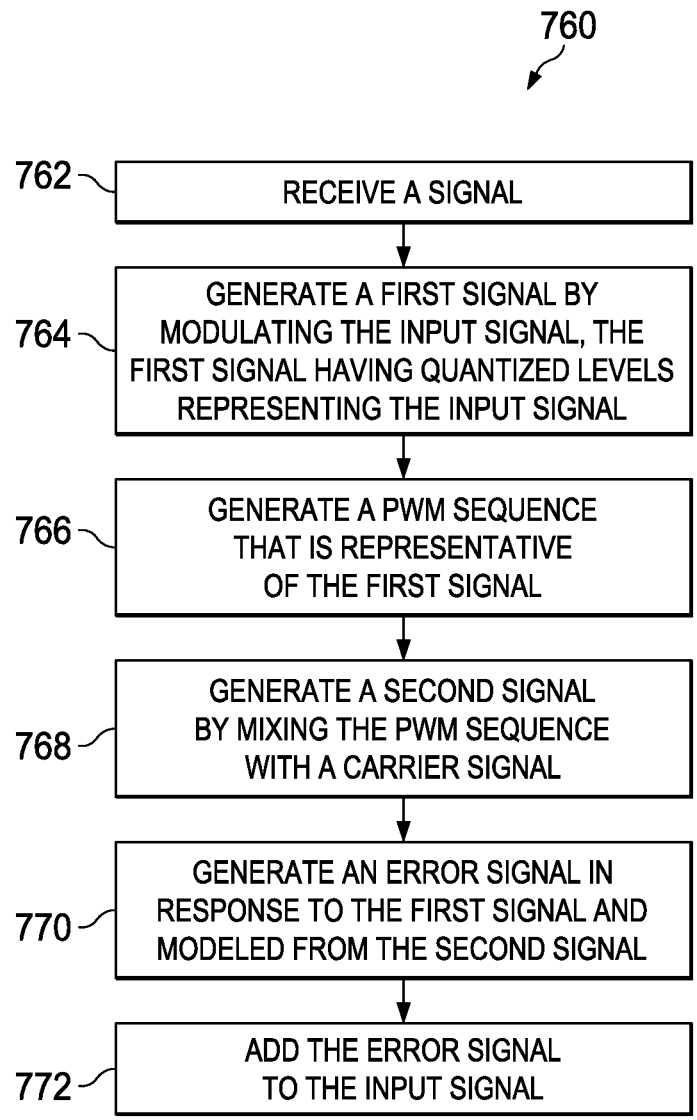
FIG. 8 is a flow chart describing the operation of the circuit of FIG. 7.

A method for canceling nonlinear distortions in pulse width modulated (PWM) sequences is illustrated at 760 in FIG. 8. The method includes receiving an input signal, block 762. The method also includes, as shown at block 764, generating a first signal by modulating the input signal, the first signal having quantized levels representing the input signal. The method includes, as shown at block 766, generating a pulse width modulated (PWM) sequence representative of the first signal. The method further includes, as shown at block 768, generating a second signal by mixing the PWM sequence mixed with a carrier signal. As shown at block 770, the method includes generating an error signal in response to the first signal and modeled from the second signal. In block 772 the error signal is added to the input signal.

Another embodiment of a circuit 800 for reducing nonlinearities is shown in FIG. 9. The circuit 800 is similar to the circuit 700 of FIG. 7, but it is a cascaded system. An I processor 802 and a Q processor 804 both use a cascade system to process a complex signal. The I processor 802 includes a first delta-sigma modulator 810 and a second delta-sigma modulator 812. A circuit 814 that generates the above-described error signal in the I processor 802 models the nonlinearities in the PWM sequences generated by the I processor. The modeled nonlinearities are fed back to the input of the second delta-sigma modulator 812. The error signal reduces nonlinearities in the Q processor 804 as shown by FIG. 9. Likewise, a circuit 820 in the Q processor 804 generates an error signal that reduces nonlinearities in the same manner.

In some embodiments of the circuits described above, the error signals generated by the circuits 232, 234, 730, 814, and 820 are not directly subtracted from the input signals. Rather, the error signals are added to state variables in the delta-sigma modulators. In embodiments where other modulators are used, the error signals are added to state variables in those modulators.

While certain embodiments of circuits and methods have been described in detail herein as an aid to understanding of applicants' inventive concepts, it is to be understood that the inventive concepts may be otherwise variously embodied and employed and that the appended claims are intended to be construed to include such variations, except insofar as limited by the prior art.

What is claimed is:
1. A method for canceling nonlinear distortions in pulse width modulated (PWM) sequences, the method comprising:
 receiving an input signal;
 generating a first signal by modulating the input signal, the first signal having quantized levels representing the input signal;
 generating a pulse width modulated (PWM) sequence representative of the first signal;

generating a second signal by mixing the PWM sequence with a carrier signal;

generating an error signal in response to the first signal and modeled from the second signal; and adding the error signal to the input signal.

2. The method of claim 1, wherein the first signal is generated by a modulator and wherein the error signal is added to the input signal by adding to the state variables of the modulator.

3. The method of claim 1, wherein generating a first signal includes generating a discrete delta-sigma modulated signal.

4. The method of claim 3, wherein generating a PWM sequence includes generating a discrete PWM sequence in response to the discrete delta-sigma modulated signal.

5. The method of claim 4, wherein the carrier signal is a discrete quadrature signal.

6. The method of claim 1, wherein generating an error signal includes:

monitoring the first signal; and modeling nonlinearities in the second signal based on the first signal.

7. The method of claim 1, wherein generating an error signal includes generating an error signal using a Hammerstein model based on the first signal.

8. The method of claim 1, wherein the first signal has a discrete number of possible levels in a sampling period and wherein the Hammerstein model includes a look up table corresponding to the discrete number of levels.

9. The method of claim 1, wherein the error signal is generated using at least one coefficient that is proportional to $(-1)^m m/M^2$, where m is the width of a pulse in the second signal and M is the voltage level in the first signal.

10. A circuit for generating a pulse width modulated sequence, the circuit comprising:

an input for receiving an input signal;

an adder coupled to the input, wherein the adder is for adding and for outputting a sum thereof via an output of the adder;

a first modulator coupled to the output of the adder, wherein the first modulator is for generating a discrete number of voltage levels representative of the input signal in response to the output of the adder, and for outputting the discrete number of voltage levels via an output of the first modulator;

a pulse width modulator coupled to the output of the first modulator, wherein the pulse width modulator is for generating pulse width modulated sequences in response to the output of the first modulator via an output of the pulse width modulator;

a mixer coupled to the output of the pulse width modulator, wherein the mixer is for mixing the signal from the output of the pulse width modulator with a carrier signal; and circuitry for generating error signals, the circuitry having an input coupled to the output of the first modulator, wherein the circuitry is for generating error signals in response to signals generated by the mixer and modeled from the signal output from the mixer, the circuitry outputting the error signals to the adder via an output of the circuitry.

11. The circuit of claim 10, wherein the first modulator is a delta-sigma modulator.

12. The circuit of claim 10, wherein the pulse width modulator generates pulses having discrete lengths based on the voltage levels generated by the first modulator.

13. The circuit of claim 11, wherein the circuitry for generating error signals generates a discrete number of error signals based on the discrete number of voltage levels able to be generated by the first modulator.

14. The circuit of claim 13, wherein the circuitry for generating error signals includes circuitry for determining the error signals based on the output of the mixer.

15. The circuit of claim 13, wherein the circuitry for generating error signals is coupled to a look up table, the look up table containing coefficients for the error signals related to the number of voltage levels able to be generated by the first modulator.

16. The circuit of claim 10, wherein the error signals are related to a Hammerstein model.

17. The method of claim 10, wherein the error signals are generated using at least one coefficient that is proportional to $(-1)^m m/M^2$, where m is the width of a signal generated by the pulse width modulator and M is the number of possible voltage levels generated by the first modulator.

18. A circuit for generating pulse width modulated sequences, the circuit comprising:

an input for receiving an input signal;

a first adder coupled to the input, the first adder having an output;

a second adder coupled to the input, the second adder having an output;

a first delta-sigma modulator coupled to the output of the first adder, the first delta-sigma modulator having an output;

a pulse width modulator coupled to the output of the first delta-sigma modulator, the pulse width modulator having an output;

a mixer coupled to the output of the pulse width modulator for mixing a sequence from the output of the pulse width modulator with a carrier signal; and circuitry for generating error signals, the circuitry having an input coupled to the output of the delta-sigma modulator, wherein the circuitry is for generating error signals in response to signals generated by the delta-sigma modulator and modeled from the signal output from the mixer, the circuitry outputting the error signals to the second adder via an output of the circuitry.

19. The circuit of claim 18, wherein the error signals are generated using at least one coefficient that is proportional to $(-1)^m m/M^2$, where m is the width of a signal generated by the pulse width modulator and M is the number of possible voltage levels output by the first delta-sigma modulator.

20. The circuit of claim 18 further comprising a second delta sigma modulator coupled to the second adder.

* * * * *